US011249514B2

(12) United States Patent
Kuo et al.

(10) Patent No.: US 11,249,514 B2
(45) Date of Patent: Feb. 15, 2022

(54) HEAD-MOUNTED DISPLAY DEVICE

(71) Applicant: HTC Corporation, Taoyuan (TW)

(72) Inventors: Chih-Yao Kuo, Taoyuan (TW); Chin-Kai Sun, Taoyuan (TW); Chung-Chiao Tan, Taoyuan (TW)

(73) Assignee: HTC Corporation, Taoyuan (TW)

( * ) Notice: Subject to any disclaimer, the term of this patent is extended or adjusted under 35 U.S.C. 154(b) by 0 days.

(21) Appl. No.: 16/921,943

(22) Filed: Jul. 7, 2020

(65) Prior Publication Data

US 2021/0303024 A1    Sep. 30, 2021

Related U.S. Application Data

(60) Provisional application No. 62/994,291, filed on Mar. 25, 2020.

(51) Int. Cl.
*H05K 7/20* (2006.01)
*G06F 1/16* (2006.01)

(52) U.S. Cl.
CPC ........... *G06F 1/163* (2013.01); *H05K 7/2039* (2013.01); *H05K 7/20172* (2013.01); *H05K 7/20972* (2013.01)

(58) Field of Classification Search
CPC .. G06F 1/163; H05K 7/20172; H05K 7/2039; H05K 7/20972
See application file for complete search history.

(56) References Cited

U.S. PATENT DOCUMENTS

| 10,261,555 | B1* | 4/2019 | Cooper | H05K 7/20972 |
| 10,466,740 | B2* | 11/2019 | Miller | G06F 1/1686 |
| 2018/0196485 | A1 | 7/2018 | Cheng et al. | |
| 2018/0307282 | A1 | 10/2018 | Allin et al. | |
| 2018/0324978 | A1 | 11/2018 | Lin | |
| 2020/0110449 | A1 | 4/2020 | Chang et al. | |
| 2020/0359886 | A1* | 11/2020 | Azar | A61B 3/101 |

FOREIGN PATENT DOCUMENTS

| CN | 206196228 | 5/2017 |
| CN | 208387006 | 1/2019 |

OTHER PUBLICATIONS

"Office Action of Taiwan Counterpart Application", dated Jul. 7, 2021, p. 1-p. 4.

* cited by examiner

*Primary Examiner* — Mukundbhai G Patel
(74) *Attorney, Agent, or Firm* — JCIPRNET

(57) ABSTRACT

A head-mounted display device includes a casing, a control circuit board and a fan. The casing has a heat dissipation hole, and a face side and an external side opposite each other. The control circuit board is disposed in the casing. The fan is disposed in the casing and located between the control circuit board and the face side of the casing, and is configured to generate an air flow flowing from the face side toward the heat dissipation hole.

9 Claims, 6 Drawing Sheets

HEAD-MOUNTED DISPLAY DEVICE

CROSS-REFERENCE TO RELATED APPLICATION

This application claims the priority benefit of U.S. provisional application Ser. No. 62/994,291, filed on Mar. 25, 2020. The entirety of the above-mentioned patent application is hereby incorporated by reference herein and made a part of this specification.

TECHNICAL FIELD

The present application relates to a head-mounted display device, and in particular to a head-mounted display device capable of improving wearing comfort.

DESCRIPTION OF RELATED ART

With the development of the technology industry, there have appeared many types of head-mounted display devices. Taking an eye mask type head-mounted display device as an example, after a user wears such a display device, not only can the user see a three-dimensional image, but the image can change as the user turns their head, thereby providing the user with a more realistic experience. The head-mounted display device can even be applied in mixed reality (MR).

However, after the user has worn the head-mounted display device for a period of time, heat and moisture of the user's face, in addition to waste heat generated by the head-mounted display device in operation, lead to a gradual increase in temperature and humidity of the air in a space between the user's face and the head-mounted display device, causing the user discomfort. Therefore, how to provide a more comfortable user experience is a very important subject in this field.

SUMMARY

The present application provides a head-mounted display device capable of improving wearing comfort.

A head-mounted display device of the present application includes a casing, a control circuit board and a fan. The casing has a heat dissipation hole, and a face side and an external side opposite each other. The control circuit board is disposed in the casing. The fan is disposed in the casing and located between the control circuit board and the face side of the casing, and is configured to generate an air flow flowing from the face side toward the heat dissipation hole.

Based on the above, in the head-mounted display device of the present application, the fan is disposed between the control circuit board and the face side of the casing. It is possible to not only generate an air flow to actively dissipate heat, but also to prevent transfer of heat from the control circuit board to the face side, which helps to improve a user's comfort in wearing the head-mounted display device.

DESCRIPTION OF THE EMBODIMENTS

Figure 1:
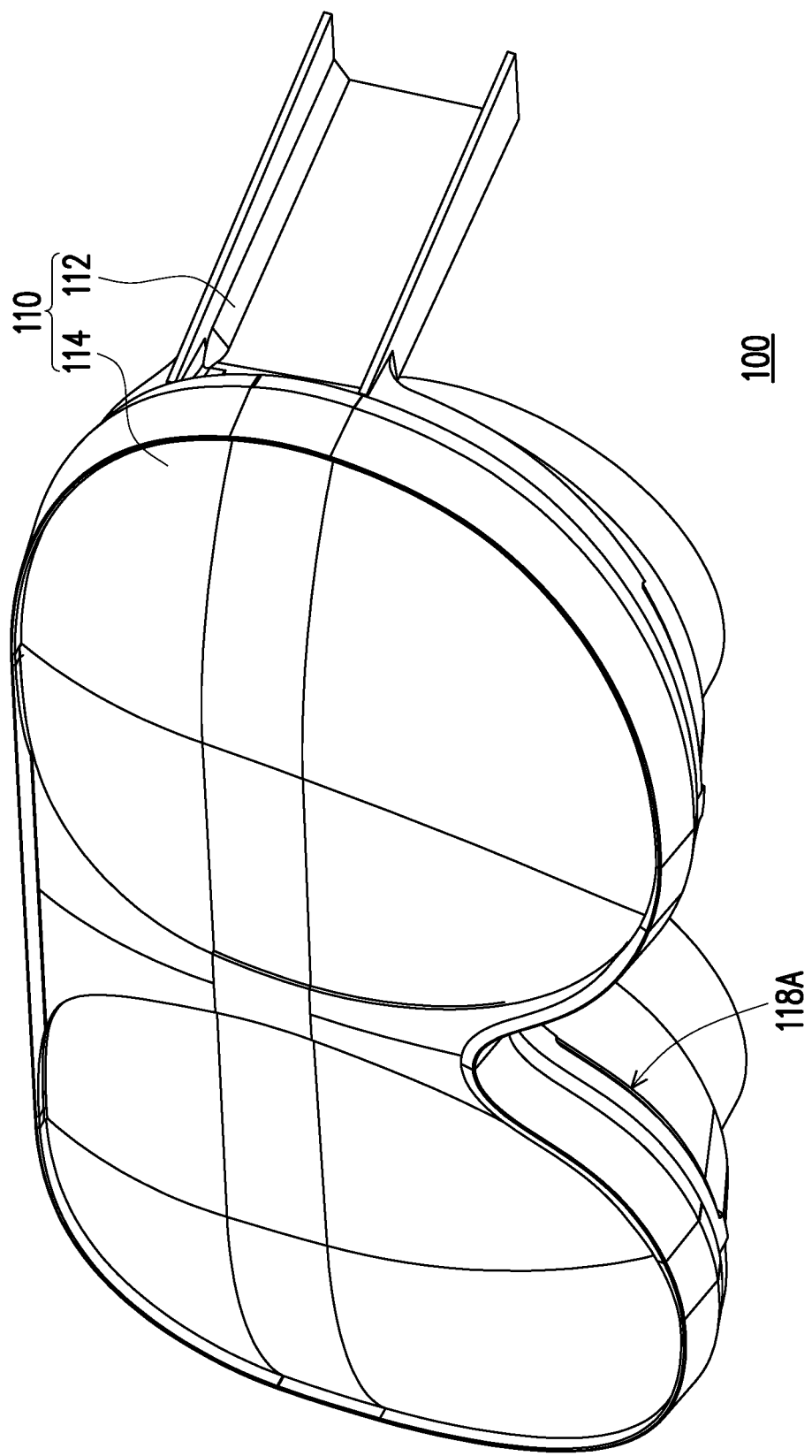
FIG. 1 is a schematic three-dimensional view of a head-mounted display device according to an embodiment of the invention.
Figure 2:
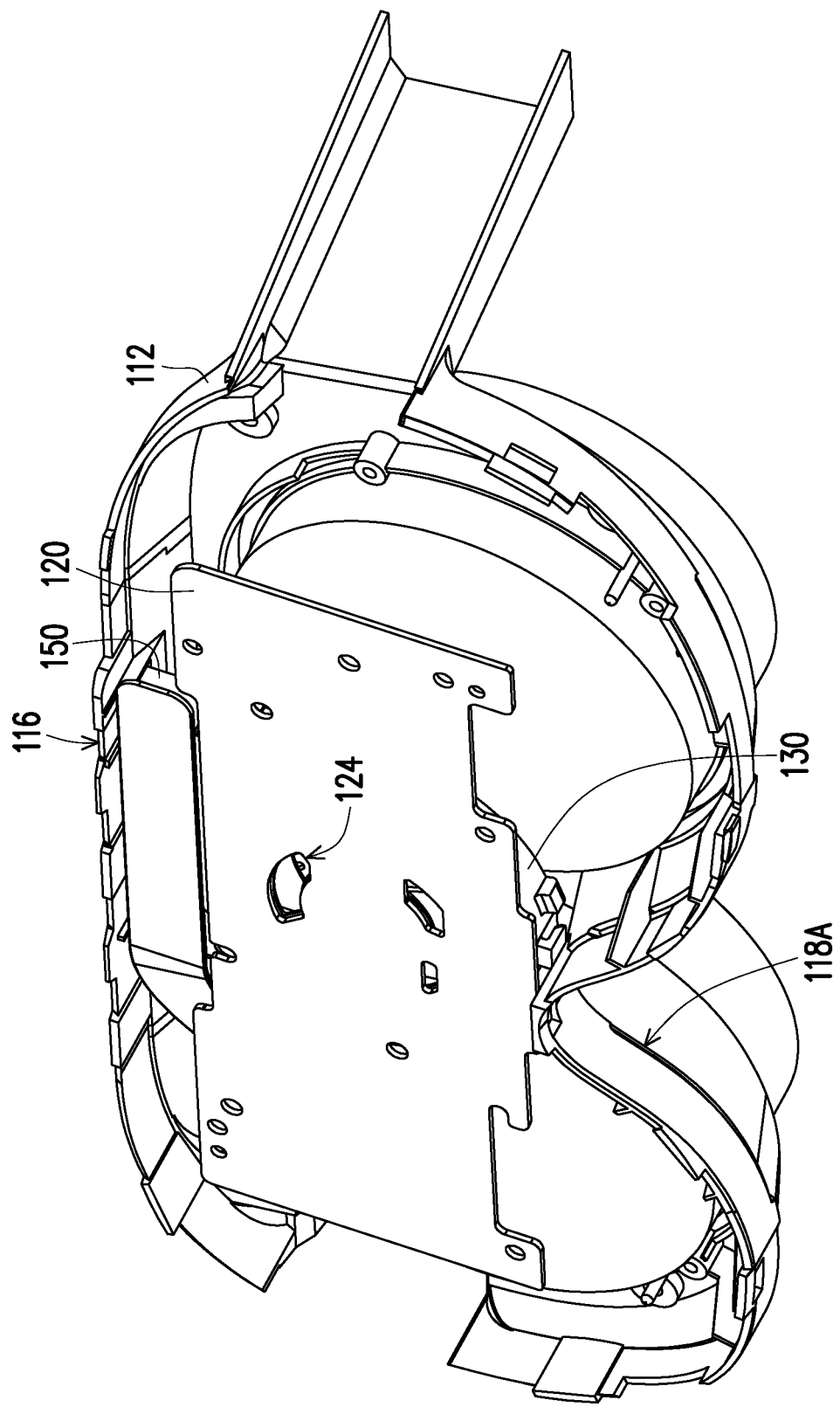
FIG. 2 is a schematic view of the head-mounted display device of FIG. 1 after removal of some components.

FIG. 1 is a schematic three-dimensional view of a head-mounted display device according to an embodiment of the invention. FIG. 2 is a schematic view of the head-mounted display device of FIG. 1 after removal of some components. Referring to FIG. 1 and FIG. 2, a head-mounted display device 100 of the present embodiment includes a casing 110, a control circuit board 120, and a fan 130. The control circuit board 120 and the fan 130 are both disposed in the casing 110. The appearance of the casing 110 of the present embodiment is for illustrative purposes only, and the present application is not limited thereto. In addition, the casing 110 may be connected to other fastening components so that the head-mounted display device 100 can be firmly worn on a user's head. The casing 110 has a face side 112 and an external side 114 opposite each other. When the head-mounted display device 100 is worn on the user's head, the face side 112 faces the user's face, and the external side 114 faces the outside. The fan 130 is located between the control circuit board 120 and the face side 112 of the casing 110. In other words, the control circuit board 120 is located between the fan 130 and the external side 114 of the casing 110.

Figure 3:
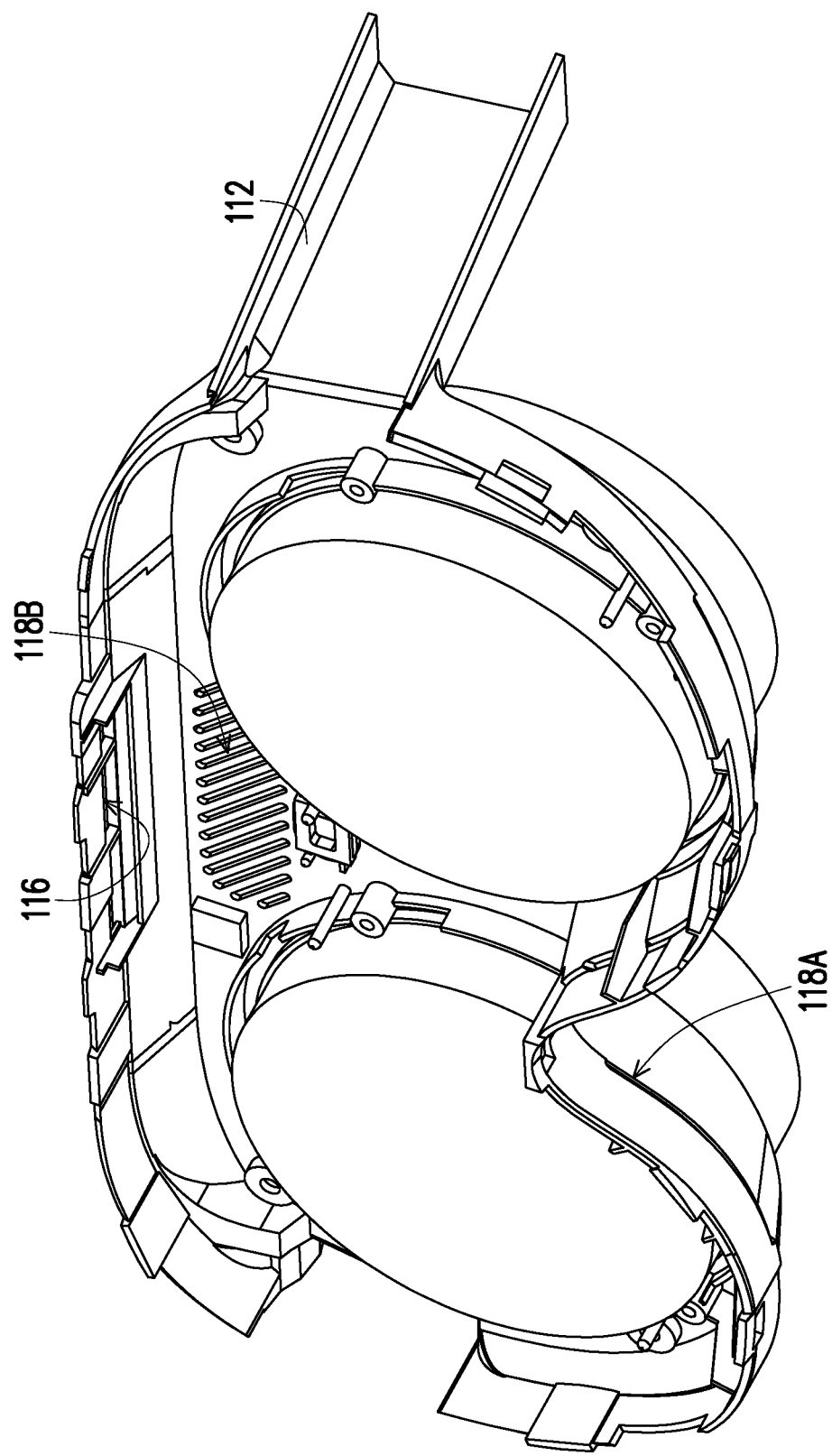
FIG. 3 is another schematic view of the head-mounted display device of FIG. 1 after removal of some components.
Figure 4:
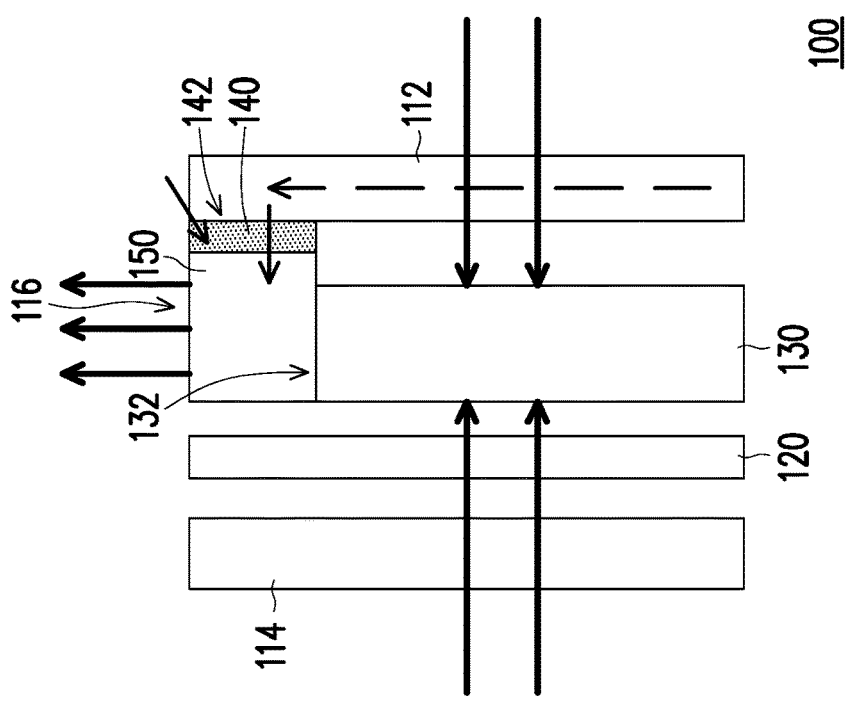
FIG. 4 is a schematic view of relative positions of main components of the head-mounted display device of FIG. 1.

FIG. 3 is another schematic view of the head-mounted display device of FIG. 1 after removal of some components. FIG. 4 is a schematic view of relative positions of main components of the head-mounted display device of FIG. 1. Referring to FIG. 3 and FIG. 4, the casing 110 further has a heat dissipation hole 116, and arrows schematically indicate air flow paths. The fan 130 is configured to generate an air flow flowing from the face side 112 toward the heat dissipation hole 116. In other words, the air flow generated by the fan 130 first passes through the face side 112, and then flows toward the heat dissipation hole 116 and escapes to the outside from the heat dissipation hole 116. In another embodiment, the fan 130 may suck the air from the outside, the air passing through the external side 114 of the casing 110, and then flowing toward the heat dissipation hole 116 and escaping to the outside from the heat dissipation hole 116.

Figure 5:
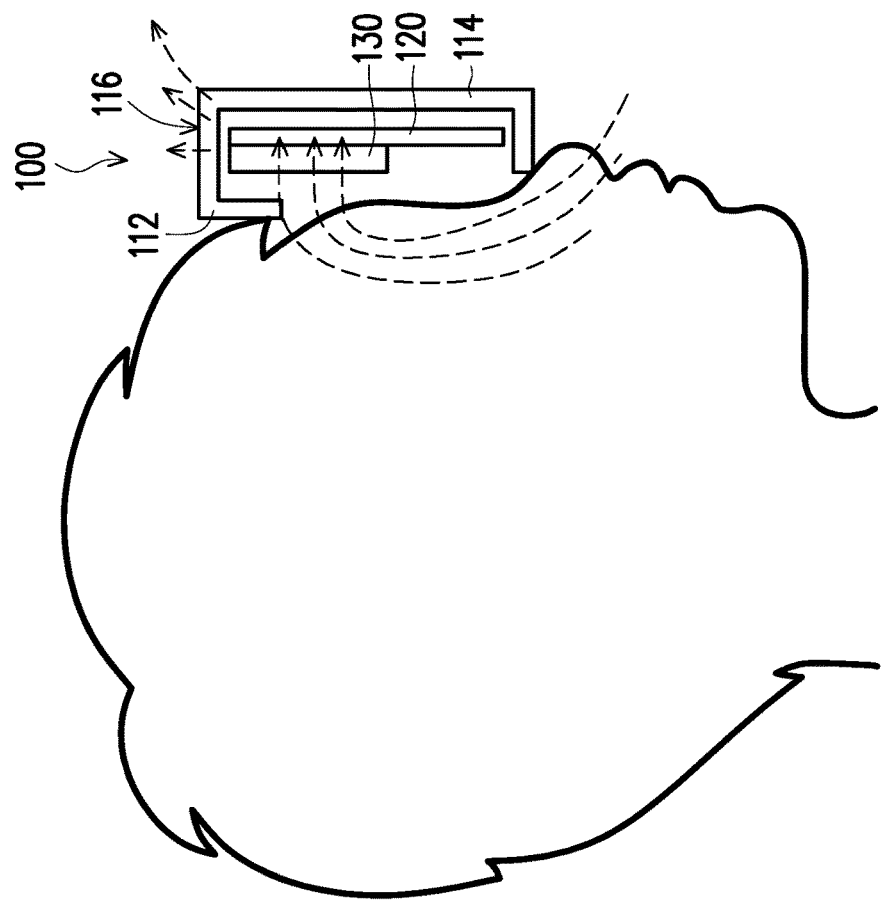
FIG. 5 illustrates a heat transfer path when a user wears the head-mounted display device of FIG. 1.

FIG. 5 illustrates a heat transfer path when the user wears the head-mounted display device of FIG. 1. Referring to FIG. 4 and FIG. 5, when the face side 112 of the casing 110 gradually heats up as a usage time of the head-mounted display device 100 increases, cold air from the outside may be taken into the casing 110 by operation of the fan 130. The cold air passes through the face side 112 to take the heat away. Therefore, both the temperature and humidity of the air in a space between the user and the casing 110 can be lowered, thereby improving the user's wearing comfort. Moreover, the air whose temperature is raised due to passage through the face side 112 may escape to the outside from the heat dissipation hole 116 by operation of the fan 130.

Figure 6:
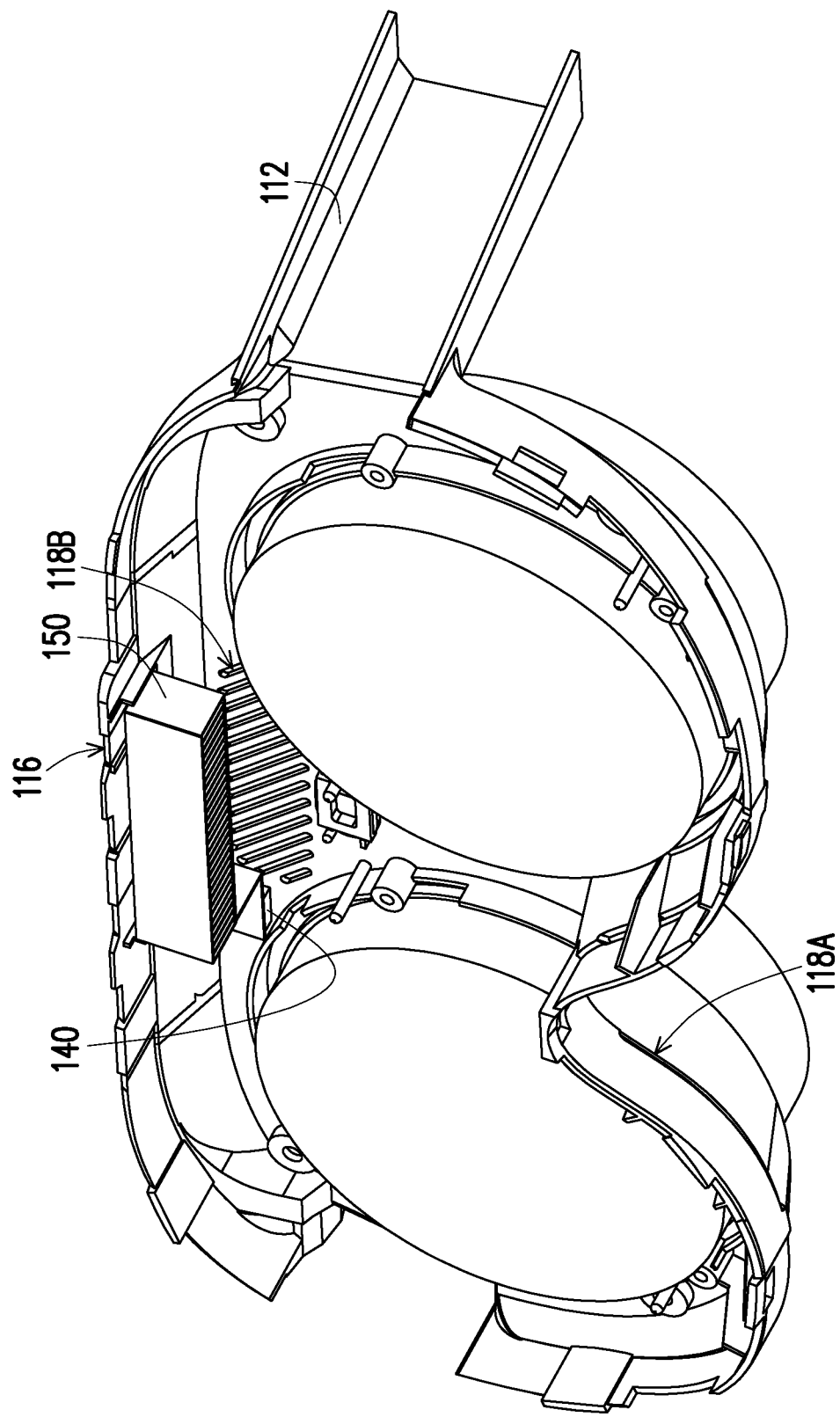
FIG. 6 is still another schematic view of the head-mounted display device of FIG. 1 after removal of some components.
Figure 7:
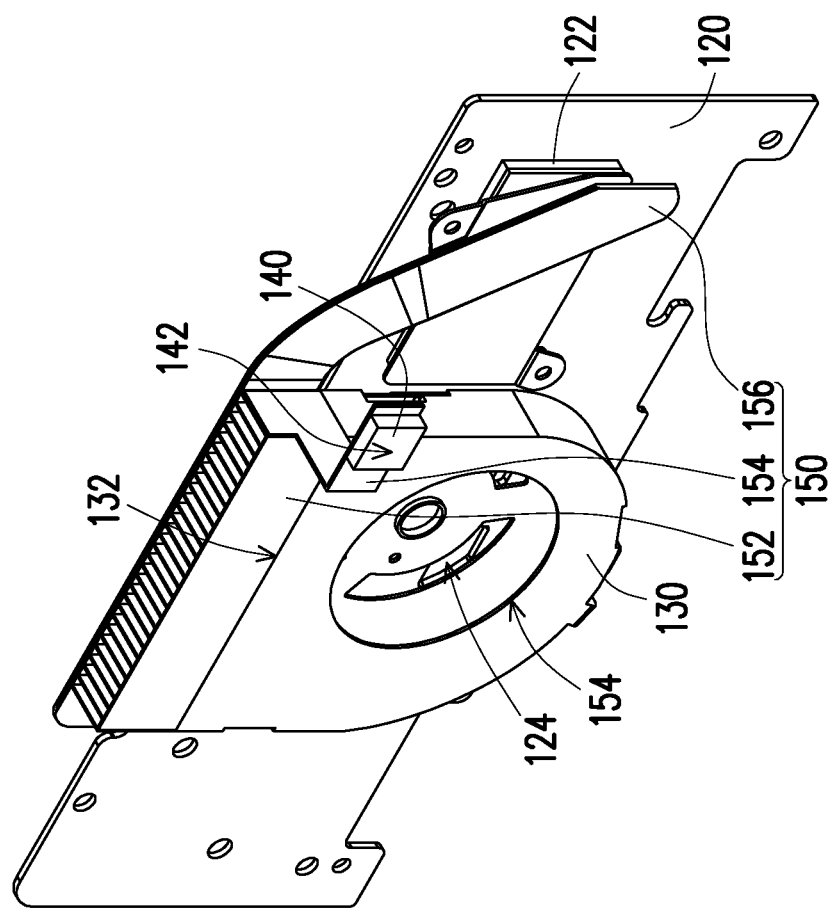
FIG. 7 is a schematic three-dimensional view of the head-mounted display device of FIG. 1 from another viewing angle.

FIG. 6 is still another schematic view of the head-mounted display device of FIG. 1 after removal of some components. FIG. 7 is a schematic three-dimensional view of the head-mounted display device of FIG. 1 from another viewing angle. Referring to FIG. 6 and FIG. 7, the head-mounted display device 100 of the present embodiment may further include a thermoelectric cooler 140 that is in thermal contact between the fan 130 and the face side 112 of the casing 110. Thermal contact as referred to herein refers to a heat transfer path provided between two components in thermal contact with each other. However, the two components may be in direct physical contact or in indirect contact. In other words, the heat on the face side 112 of the casing 110 may be transferred to the fan 130 via the thermoelectric cooler 140 by thermal conduction. In addition, by applying electricity to the thermoelectric cooler 140, an active heat transfer effect can be produced. This active method has higher heat conduction efficiency than a method simply using temperature difference.

Referring to FIG. 6 and FIG. 7, in the present embodiment, the head-mounted display device 100 may further include a heat sink 150. The heat sink 150 has a fin side 152 and a first contact side 154. The fin side 152 is located between an air outlet 132 of the fan 130 and the heat dissipation hole 116. The thermoelectric cooler 140 is in thermal contact between the first contact side 154 and the face side 112 of the casing 110.

Referring to FIG. 4 and FIG. 7, the heat on the face side 112 may be actively taken to the first contact side 154 of the heat sink 150 by the thermoelectric cooler 140, and then transferred from the first contact side 154 to the fin side 152. Meanwhile, the air flow generated during operation of the fan 130 is sent out from the air outlet 132 and takes the heat away from the fin side 152 located at the air outlet 132. Moreover, the air flow carrying the heat flows to the outside from the heat dissipation hole 116. With this architecture, the temperature on the face side 112 can be efficiently lowered, thereby improving the user's wearing comfort.

In addition, the heat sink 150 of the present embodiment may further have a second contact side 156 that is in thermal contact with a control chip 122 of the control circuit board 120. Therefore, heat generated by the control chip 122 during operation may be transferred from the second contact side 156 to the fin side 152. Meanwhile, the air flow generated during operation of the fan 130 is sent out from the air outlet 132 and takes the heat away from the fin side 152 located at the air outlet 132. Moreover, the air flow carrying the heat flows to the outside from the heat dissipation hole 116. With this architecture, the temperature of the control circuit board 120 can be efficiently lowered, thereby lowering an overall temperature of the head-mounted display device 100, and improving the user's wearing comfort.

In the present embodiment, a cooling surface 142 of the thermoelectric cooler 140 is in thermal contact with the face side 112 of the casing 110. In other words, during operation of the thermoelectric cooler 140, a heat conduction direction is from the cooling surface 142 toward the opposite side. Therefore, the thermoelectric cooler 140 may actively transfer heat from the face side 112 to the heat sink 150.

Referring to FIG. 2 and FIG. 7, in the present embodiment, the control circuit board 120 may have a hole 124. A position of the hole 124 corresponds to an air inlet 134 of the fan 130. Therefore, hot air on another side of the control circuit board 120 may be sucked into the fan 130 from the hole 124 and the air inlet 134, and then flow from the heat dissipation hole 116 to the outside.

The fan 130 of the present embodiment is exemplified by a centrifugal fan. That is, an air-in direction is different from an air-out direction. However, the present application is not limited thereto.

Referring to FIG. 3 and FIG. 5, in the present embodiment, the casing 110 may further have a first air inlet hole 118A. The first air inlet hole 118A and the heat dissipation hole 116 are located on opposite sides of the casing 110. For example, when the head-mounted display device 100 is worn on the user's head, the first air inlet hole 118A is located on a lower side, and the heat dissipation hole 116 is located on an upper side. This arrangement conforms to the trend of natural heat convection and helps to improve heat dissipation efficiency. However, in the present embodiment, the fan 130 that is capable of performing forced heat convection is further disposed. Hence, in the present application, the arrangement manner of the first air inlet hole 118A and the heat dissipation hole 116 is not limited.

In the present embodiment, the casing 110 may further have a second air inlet hole 118B. A position of the second air inlet hole 118B corresponds to an area between the user's eyebrows. By providing the second air inlet hole 118B, high-temperature and humid air between the head-mounted display device 100 and the user's face can be sucked into the fan 130, and the air then flows to the outside from the heat dissipation hole 116.

In the present embodiment, a position of the fan 130 corresponds to, for example, the area between the user's eyebrows. With this arrangement, a more balanced weight distribution can be provided in the head-mounted display device 100. Moreover, in the head-mounted display device 100, an optical system is generally provided at a position corresponding to each of the user's eyes. Therefore, by providing the fan 130 at the position corresponding to the area between the user's eyebrows, the volume of the head-mounted display device 100 can be easily reduced.

In summary, in the head-mounted display device of the present application, the fan is disposed between the control circuit board and the face side of the casing. Thus, heat is prevented from being transferred from the control circuit board to the face side, and the fan can actively dissipate heat. Therefore, the temperature and humidity on the face side can be effectively lowered, which helps to improve the user's comfort in wearing the head-mounted display device.

What is claimed is:

1. A head-mounted display device, comprising:
   a casing, having a heat dissipation hole, and a face side and an external side opposite each other;
   a control circuit board, disposed in the casing; and
   a fan, disposed in the casing and located between the control circuit board and the face side of the casing, configured to generate an air flow flowing from the face side toward the heat dissipation hole,
   wherein the control circuit board has a hole whose position matching with an air inlet of the fan.

2. The head-mounted display device according to claim 1, further comprising a thermoelectric cooler in thermal contact between the fan and the face side of the casing.

3. The head-mounted display device according to claim 2, further comprising a heat sink having a fin side and a first contact side, wherein the fin side is located between an air outlet of the fan and the heat dissipation hole, and the thermoelectric cooler is in thermal contact between the first contact side and the face side of the casing.

4. The head-mounted display device according to claim 3, wherein the heat sink further has a second contact side in thermal contact with a control chip of the control circuit board.

5. The head-mounted display device according to claim 2, wherein a cooling surface of the thermoelectric cooler is in thermal contact with the face side of the casing.

6. The head-mounted display device according to claim 1, wherein the fan is a centrifugal fan.

7. The head-mounted display device according to claim 1, wherein the casing further has a first air inlet hole, and the first air inlet hole and the heat dissipation hole are located on opposite sides of the casing.

8. The head-mounted display device according to claim 1, wherein the casing further has a second air inlet hole whose position corresponds to an area between eyebrows of the user.

9. The head-mounted display device according to claim 1, wherein a position of the fan corresponds to an area between eyebrows of the user.

* * * * *